United States Patent
Radens et al.

(10) Patent No.: US 7,064,410 B2
(45) Date of Patent: Jun. 20, 2006

(54) MOS ANTIFUSE WITH LOW POST-PROGRAM RESISTANCE

(75) Inventors: Carl J. Radens, LaGrangeville, NY (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/872,173

(22) Filed: Jun. 18, 2004

(65) Prior Publication Data

US 2004/0227209 A1    Nov. 18, 2004

Related U.S. Application Data

(62) Division of application No. 10/063,376, filed on Apr. 17, 2002, now Pat. No. 6,794,726.

(51) Int. Cl.
    *H01L 29/00*    (2006.01)
(52) U.S. Cl. .......................... 257/530; 257/529
(58) Field of Classification Search ................ 257/530, 257/529; 438/131, 132, 215, 281, 333, 467, 438/600, 601, 957
    See application file for complete search history.

(56) References Cited

U.S. PATENT DOCUMENTS

| | | | |
|---|---|---|---|
| 4,914,055 A | 4/1990 | Gordon et al. | |
| 5,219,782 A | 6/1993 | Liu et al. | |
| 5,324,681 A | 6/1994 | Lowrey et al. | |
| 5,395,797 A | 3/1995 | Chen et al. | |
| 5,469,077 A | 11/1995 | Cox | |
| 5,493,147 A | 2/1996 | Holzworth et al. | |
| 5,502,000 A | 3/1996 | Look et al. | |
| 5,587,613 A | 12/1996 | Iranmanesh | |
| 5,625,220 A | 4/1997 | Liu et al. | |
| 5,793,094 A | 8/1998 | Sanchez et al. | |
| 5,856,213 A | 1/1999 | Love et al. | |
| 5,913,138 A | 6/1999 | Yamaoka et al. | |
| 5,970,372 A | 10/1999 | Hart et al. | |
| 6,020,777 A | 2/2000 | Bracchitta et al. | |
| 6,069,064 A | 5/2000 | Cutter et al. | |
| 6,087,707 A | 7/2000 | Lee et al. | |
| 6,096,580 A | 8/2000 | Iyer et al. | |

(Continued)

FOREIGN PATENT DOCUMENTS

JP    9055475 A    2/1997

OTHER PUBLICATIONS

"Impact of Shallow Trench Isolation on Reliability of Buried and Surface Channel Sub-um PFET", Tonti, et al., 1995, pp. 24-29.

(Continued)

*Primary Examiner*—Steven Loke
(74) *Attorney, Agent, or Firm*—Schmeiser, Olsen & Watts; Anthony Canale

(57) ABSTRACT

A semiconductor device having an increased intersection perimeter between edge regions of a first conductor and portions of a second conductor is disclosed. In one embodiment, the intersection perimeter is the region where the perimeter of a gate structure overlaps an active area. The intersection perimeter between the conductors directs the breakdown of the dielectric material, increasing the likelihood that the programming event will be successful. In at least one embodiment, the portion of a current path that travels through a highly doped area is increased while the portion that travels through a non-highly doped area is decreased. This decreases post-program resistance, leading to better response time for the device.

14 Claims, 9 Drawing Sheets

U.S. PATENT DOCUMENTS 6,146,925 A    11/2000  Dennison
6,221,729 B1    4/2001  Dennison
6,388,305 B1    5/2002  Bertin et al.
6,574,763 B1 *  6/2003  Bertin et al. ................ 714/738

OTHER PUBLICATIONS

International Application No. PCT/US94/11002, Look, et al.
International Application No. PCT/US94/01619, Hall, et al.

* cited by examiner

MOS ANTIFUSE WITH LOW POST-PROGRAM RESISTANCE

This application is a divisional of Ser. No. 10/063,376; filed on Apr. 17, 2002, now U.S. Pat. No. 6,794,726.

BACKGROUND OF THE INVENTION

Technical Field

This invention generally relates to semiconductor circuit fabrication, and more specifically relates to antifuses in semiconductor devices.

The proliferation of electronics in the modern world is due in large part to the development of integrated circuit semiconductor devices. Because these devices are designed and used for widely differing applications, it is often beneficial to have the ability to "customize" a semiconductor device during fabrication. Customization of a semiconductor device involves changing the device circuitry to meet specific needs, as when, for example, the input and output structure of a device is optimized to allow the device to be used in a particular application.

Often, it is not cost effective to create separate fabrication lines, with different masks and other associated fabrication features, for small changes in the circuit requirements of a device. For this reason, a variety of techniques have been developed in which a device intended for a particular application may be fabricated on a fabrication line together with devices intended for many other applications, and then customized to conform to the particular application's specific requirements. In one customization technique, an existing circuit path may be cut by blowing a fuse that has been placed in the path for that purpose. Unfortunately, the use of fuses for device customization has inherent limitations. Specifically, a fuse can only be used to break a circuit path; it cannot be used to close an open circuit. Instead, customization where a previously open connection must be closed requires the use of an "antifuse." Antifuses are structures that, when first fabricated, are an open circuit. When the antifuse is "fused," the open circuit becomes closed and conduction across the antifuse becomes possible. Conventionally, an antifuse is fused by applying a sufficient voltage, called a "programming voltage" across the antifuse structure. This voltage causes a current to flow through the structure and fuse it together, resulting in a permanent electrical connection. This is referred to as a "programming event."

The existing antifuse technology has several disadvantages. For example, many existing antifuses require electrodes made of specific types of metal, which are not always compatible with common fabrication technologies. For instance, some devices require a transparent electrode and thus cannot use electrodes made of aluminum or polysilicon, which are opaque. Furthermore, some antifuse structures require a programming voltage of 12–15 volts. Applying such a voltage to the antifuse can cause damage to other circuit elements, and thus these antifuses may be incompatible with low-voltage semiconductor devices that commonly operate, for example, at 3.3 volts or 2.5 volts. Additionally, these antifuse structures will be difficult to scale to the significantly smaller sizes that will be required as semiconductor device density increases. Another significant problem with existing antifuse technology is the relatively high, or unstable, post-program resistance exhibited by the antifuse, which may interfere with desired performance.

BRIEF SUMMARY OF THE INVENTION

Therefore, an object of the invention is to provide an improved structure and method for semiconductor device customization. Another object is to provide an antifuse structure that has a low programming voltage and low post-program resistance.

In a first aspect, the present invention fills these needs by providing a semiconductor device having an increased intersection perimeter between edge regions of a first conductor and portions of a second conductor. The intersection perimeter is a region where the insulation between the conductors tends to be at its thinnest, thus directing the breakdown of the dielectric material, and increasing the likelihood that the antifuse programming event will be successful. In one embodiment, the intersection perimeter comprises the region where the perimeter of a gate structure overlaps an active area, or other doped area.

In another embodiment of the invention, the portion of a current path that travels through a highly doped area is increased while the portion of the path that travels through a non-highly doped area is decreased. This decreases post-program resistance, leading to better response time for the device. The increase of the intersection perimeter, as well as the decrease in post-program resistance, may be accomplished as a part of the normal processing steps for the device.

BRIEF DESCRIPTION OF THE SEVERAL VIEWS OF THE DRAWINGS

The foregoing and other features and advantages of the invention will be apparent from the following more particular description of specific embodiments of the invention, as illustrated in the accompanying drawings, wherein.

DETAILED DESCRIPTION OF THE INVENTION

The present invention provides a semiconductor device having a increased intersection perimeter between edge regions of a first conductor and portions of a second conductor. In one embodiment, the intersection perimeter comprises the region where the perimeter of a gate structure overlaps an active area, or other doped area. The intersection perimeter is a region where the electric field between the intersecting regions tends to be higher than it is elsewhere on the semiconductor. This is accomplished by manufacturing a structure having a known dielectric grading, hence increased electric fields, or by enhancing the fields by engineering the surrounding conductors, or by a combination of both elements. The resulting structure directs the breakdown of the dielectric material and increases the likelihood that the antifuse programming event will be successful. In at least one embodiment, the portion of a current path that travels through a highly doped area is increased while the portion of the path that travels through a non-highly doped area is decreased. This results in a decreased post-program resistance, leading to better response time for the device. The increase of the intersection perimeter, as well as the decrease in post-program resistance, may be accomplished as a part of the normal processing steps. Programming is a statistical event proportional to the thin oxide perimeter. Post program resistance is not statistical, but rather a function of the resistance data between electrodes. The methods and structures of the present invention provide embodiments to choose appropriate tradeoffs.

Figure 1:
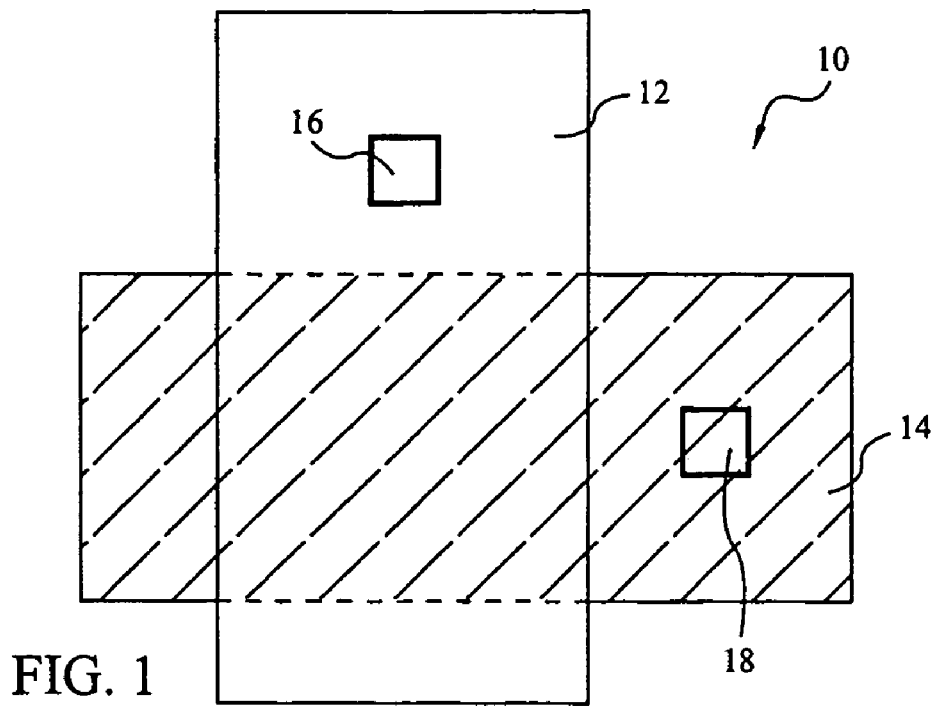
FIG. 1 is a top view of an antifuse configured according to an embodiment of the present invention.
Figure 1A:
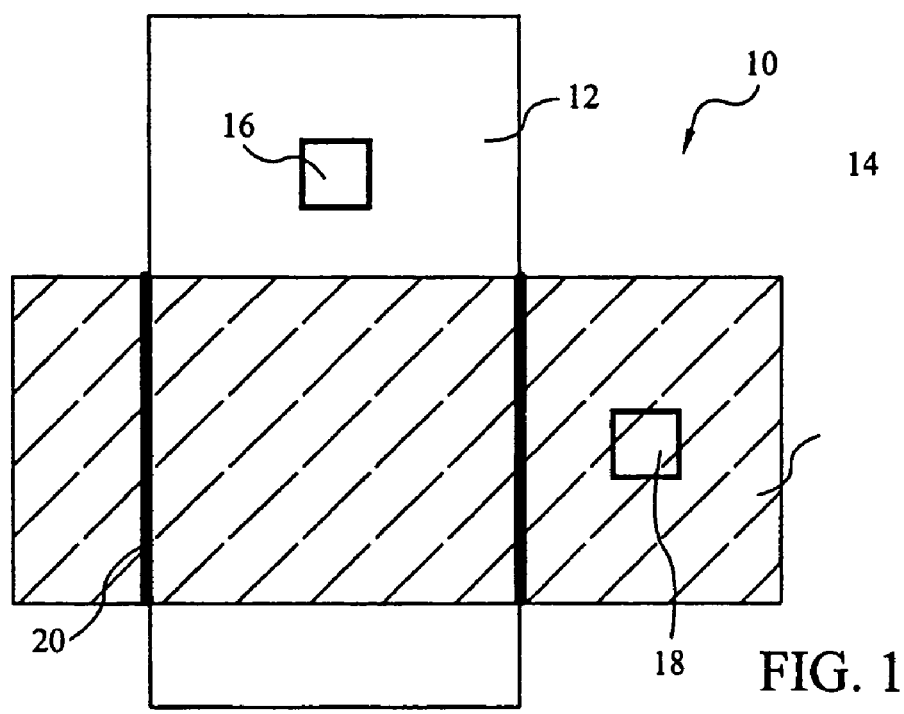
FIG. 1A is a top view of an antifuse with the intersection perimeter highlighted.

In one embodiment of the invention, the first conductor comprises a gate material and the second conductor comprises an active area bounded by shallow trench isolation. Referring now to the figures, and in particular to FIGS. 1 and 1A, a metal-oxide semiconductor (MOS) device 10 comprises a gate conductor 12 and an active area 14. Active area 14 is also a conductor, in that it provides a path along which current may flow. In one embodiment, gate conductor 12 is positioned over active area 14, with an insulative layer, not shown, in between. Gate conductor 12 includes a gate contact 16, and active area 14 includes a diffusion/well contact 18. An intersection perimeter 20 (FIG. 1A) comprises the edge regions of gate conductor 12 that lie directly above portions of active area 14. An antifuse is most likely to program at the intersection perimeter because of the increased electric field due to the thinned oxide that separates gate conductor 12 and active area 14, and the high current capability due to the increased dopant level. Intersection perimeter 20 is indicated by heavy, dark lines in FIG. 1A. In one embodiment of the invention, gate conductor 12 and active area 14 comprise elongated chip portions, with long axes positioned substantially orthogonal to each other. In other embodiments, gate conductor 12 and active area 14 may have other geometries, or may be otherwise positioned with respect to each other, as will be readily apparent to one of ordinary skill in the art.

MOS device 10 is a CMOS capacitor that functions as an antifuse in that it becomes conductive after experiencing a voltage high enough to break down the gate oxide, or other insulator, between gate conductor 12 and active area 14. MOS device 10 may be made to function as an antifuse without performing any additional processing steps beyond those normally undertaken in its manufacture, thus reducing cost and increasing efficiency. In one embodiment of the invention, the antifuse comprises an N+ gate over an N well, which provides a good conductivity path. A P+ gate over a P well may also be used, although the conductivity for this configuration is not as good as that experienced with N+ over N. P–N junctions may be used as well, but because an antifuse calls for ohmic type behavior, a P–N junction does not offer as close a fit as does a device having matching conductivity types.

In the embodiments of the invention where the antifuse is fabricated using standard processing steps, the area underneath the gate may not be implanted with additional dopant, thus making that area less conductive (more highly resistive) than the more highly doped areas, including the gate itself. For example, if an N-type implant is used, the gate conductor, along with areas of the well not covered by the gate, may be implanted to N+, but the area under the gate comprises N level only. To implant N+ under the gate would require a separate mask and an additional processing step, which would lead to additional expense.

Before any sort of programming event takes place, the path between gate contact 16 and diffusion/well contact 18 is an open circuit, and this remains true until a voltage that equals or exceeds the programming voltage is applied between contacts 16 and 18. A "programming event" is an event that causes the antifuse to become a conductor. The programming voltage is the lowest voltage that causes an antifuse to change from an open state to a closed state, thus allowing current to flow across it. The higher the programming voltage, the more likely an external power supply will be needed to generate it. Supplying power externally is less efficient, more expensive, and more time consuming. An antifuse having a programming voltage low enough to be generated by an on-chip power supply will avoid these problems. However, a programming voltage that is too low may cause an unwanted programming event. For these reasons, it is advantageous to utilize a programming voltage substantially equal to the burn-in voltage. The burn-in voltage is the voltage at which reliability testing takes place, and is thus higher than the normal operating voltage. In this description of the present invention, the phrase "burn-in voltage" means an on-chip derived voltage. The burn-in voltage is an allowed voltage level within a product, and as such may be generated within a product using any standard technique. One such technique used to generate the burn-in voltage on chip is to use a series of diode pumps, as will be familiar to one of ordinary skill in the art. In at least one embodiment of the present invention, the programming voltage of the antifuse is substantially equal to the burn-in voltage, although other embodiments may use programming voltages of other values.

A programming event has been described as an event that lowers the resistance of an antifuse, causing it to become a better conductor. Because in at least one embodiment the antifuse comprises a first conductor stacked on top of a second conductor, a programming event may be described as creating a vertical current path between conductors. A programming event may also be described in terms of where it takes place, i.e., in terms of the location on the antifuse at which the dielectric material breaks down such that a current pathway is created between the active area and the gate conductor. Programming events tend to occur at the weakest point in the oxide dielectric. Because the oxide tends to be thinnest along the intersection perimeter, the breakdown tends to occur in that area, although the possibility remains that the programming event will take place at some other point underneath the gate. This will be further explained in connection with FIG. 3. The shorter the intersection perimeter of MOS device 10, the higher the likelihood that MOS device 10 will experience a programming event somewhere other than along intersection perimeter 20.

Figure 2:
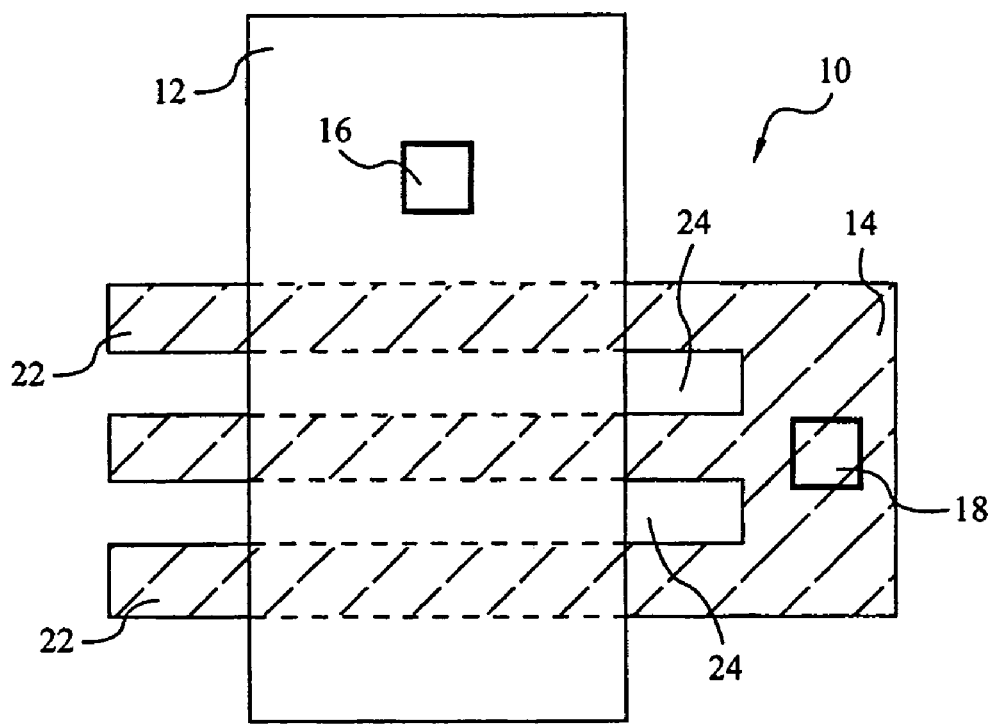
FIG. 2 is a top view of an antifuse with an increased intersection perimeter configured according to an embodiment of the present invention.
Figure 2A:
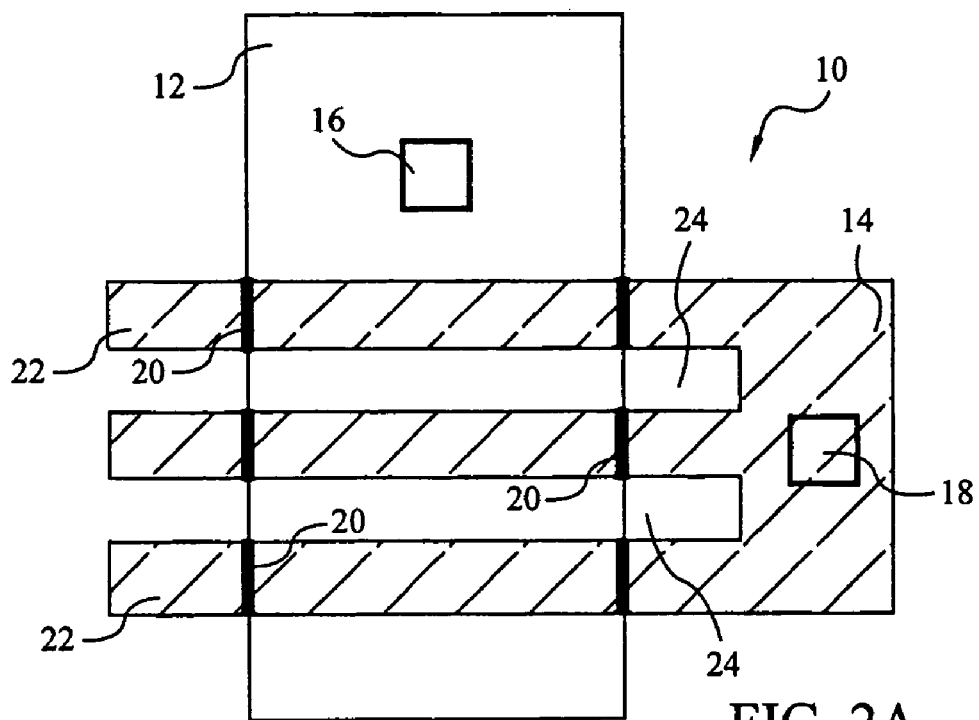
FIG. 2A is a top view of an antifuse with the increased intersection perimeter highlighted.

Referring now to FIGS. 2 and 2A, MOS device 10 comprises an active area 14 that has been provided with a plurality of fingers 22 alternating with a plurality of gaps 24. Fingers 22 are integral with active area 14, and intersection perimeter 20 forms at least a portion of the edge of fingers 22. The inclusion of fingers 22 in MOS device 10 may increase the length of intersection perimeter 20 over the length of an intersection perimeter for a finger-less device, thus increasing the total amount of thinned oxide where the application of the burn-in voltage is likely to forge a current path, and thereby increasing the likelihood that a programming event will take place successfully. As used herein, "thinned oxide" means oxide that is substantially thinner than the conventional thickness in the interior portion of a MOS device. A 30 percent thinning is shown in Impact of Shallow Trench Isolation on Reliability of Buried-and Surface-Channel sub-µm PFET, Tonti et al., 1995 IRPS Proceedings 24–29, which is incorporated herein by reference. Each finger 22 has a finger width, which in one embodiment is substantially the same for each finger 22. Although the figures depict an antifuse having three fingers, this should not be understood to limit the number of fingers in anyway.

If each finger 22 and each gap 24 is formed at the minimum feature size, i.e., if each such feature is as small as possible using the desired fabrication technology, intersection perimeter 20 will be substantially maximized for that technology, and the above advantages may be substantially realized. The fingers and gaps may be formed as part of a standard semiconductor fabrication process. To aid in the reduction in feature size, it may be desirable in some fabrication technologies to use image enhancement techniques, such as edge printing, dual tone resist, hybrid resist, sidewall image transfer, or others.

Edge printing, for example, is a means for increasing the perimeter of a lithographically-defined structural feature by using a hybrid photoresist material that is capable of printing high resolution spaces that correspond to the edges of the aerial image associated with a lithographic masking level. Edge printing can double the effective number of lines and spaces per unit length resolved by the lithographic system, and hence be used to increase the perimeter of the pattern. Edge printing means to define the gate conductor or active area level could therefore increase the effective perimeter of that pattern and be advantageous as pertaining to the teachings of the present invention. Sidewall image transfer is another means of increasing the perimeter of a lithographically-defined pattern. In this technique, a sidewall spacer is used as a secondary masking structure to pattern an underlayer feature. More specifically, a sidewall spacer is formed along the patterned edge of a lithographically-defined feature by the conformal deposition, such as low-pressure chemical vapor deposition (LPCVD), of a masking layer that will have equal thickness along both the horizontal and vertical edges of the patterned feature. This is followed by an anisotropic etching step, such as reactive ion etching (RIE), which removes material from the horizontal surfaces at a rate greater than it removes material from the vertical sidewall surfaces. The resulting sidewall spacer will remain on the vertical sidewalls of the lithographically-defined feature. The sidewall spacer will have double the effective number of lines and spaces relative to the lithographically-defined pattern. The sidewall spacer may be used as a masking layer for subsequent patterning of an underlayer, such as the gate conductor or active area level, and would therefore increase the effective perimeter of that pattern.

Figure 3:
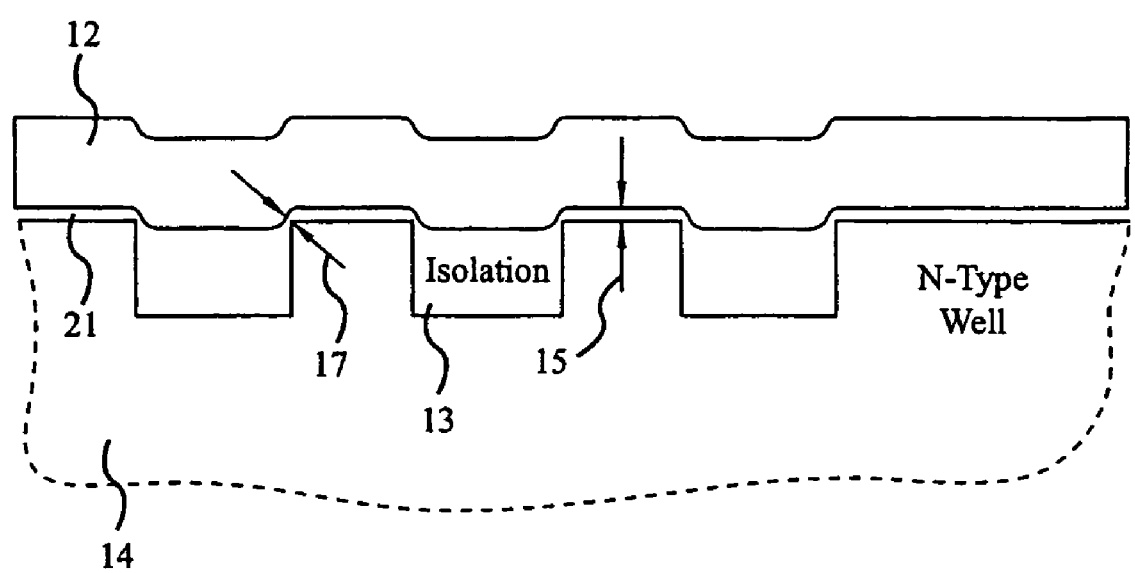
FIG. 3 is a cross sectional view of a thinned oxide layer in an antifuse configured according to an embodiment of the present invention.

Referring now to FIG. 3, gate conductor 12 and active area 14 are shown in cross section in order that the width of an oxide layer 21 may be discussed. As will be apparent to one of ordinary skill in the art, oxide layer 21 is grown on active silicon area 14. Note that oxide layer 21 has a standard thickness 15 in regions away from isolation trenches 13, and a reduced thickness 17 near the edges of isolation trenches 13. The probability of a successful programming event increases with the number of thin oxide edges present in MOS device 10. The number of thin oxide edges is also relevant to on-chip programming, in that the lower voltages conventionally available on chip may in general be sufficient to create a current path at a thin oxide edge, where they may not be sufficient to create a current path in an area of thicker oxide.

Figure 4:
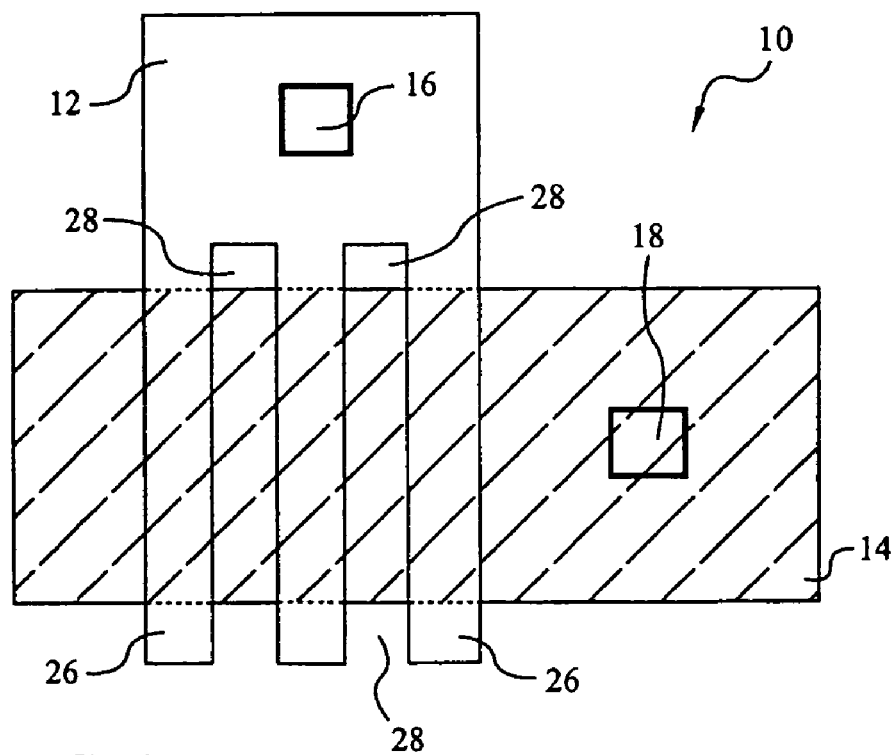
FIG. 4 is a top view of an antifuse with an increased intersection perimeter configured according to another embodiment of the present invention.
Figure 4A:
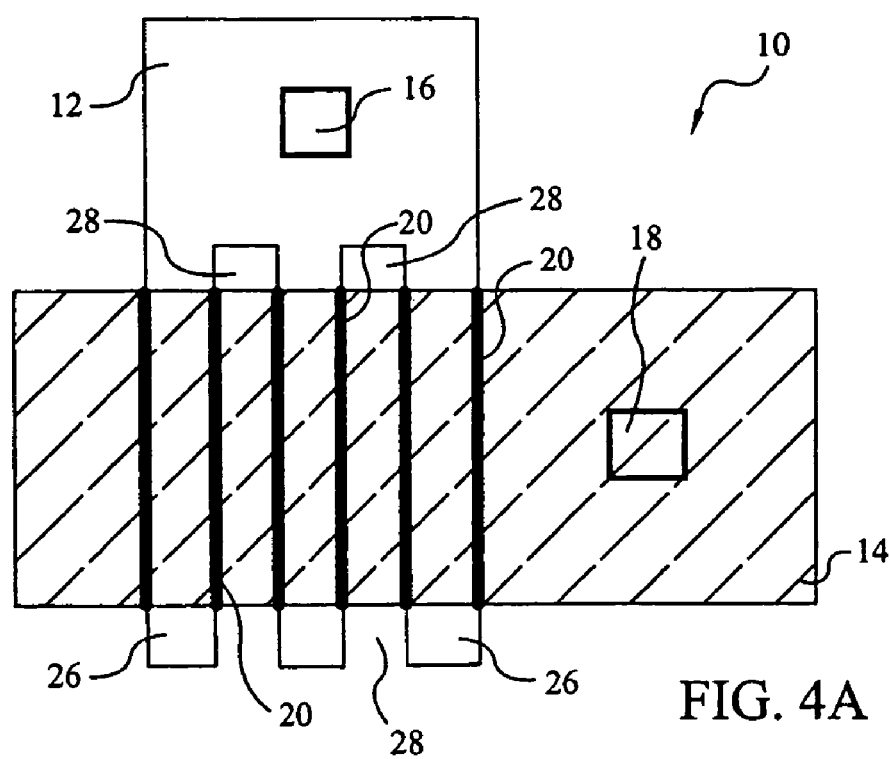
FIG. 4A is a top view of an antifuse with the increased intersection perimeter highlighted.

In the embodiment of FIG. 2, the chances of a successful programming event may be increased, but the problem of high post-program resistance remains. This has to do with the fact, discussed above, that high-resistivity N-well diffusion makes up the area underneath gate conductor 12. FIG. 4 illustrates an embodiment of the present invention that addresses the post-program resistance problem. Referring to FIGS. 4 and 4A, MOS device 10 again comprises gate conductor 12 and active area 14. Gate conductor 12 has been provided with a plurality of fingers 26 and gaps 28. This embodiment provides an increased intersection perimeter 20, with its attendant increase in the chances of a successful programming event. A further advantage of the FIG. 4 embodiment is that post-program resistance decreases, as will be further explained in the following paragraph.

Recall that gate conductor 12 overlies active area 14, and prevents low-resistivity N+ deposition in the areas it covers, leaving high-resistivity N diffusion underneath the gate. By removing portions of gate conductor 12, N+ implants may be deposited on active area 14 in the regions exposed under gaps 28. This process decreases the total amount of N diffusion and increases the amount of N+, thus lowering overall resistance and improving the speed of MOS device 10. In one embodiment, gate conductor 12 is patterned before dopant implantation takes place, meaning the regions exposed under gaps 28 are not doped separately, as the above description implies, but together with gate conductor 12 in one simultaneous process.

Figure 5:
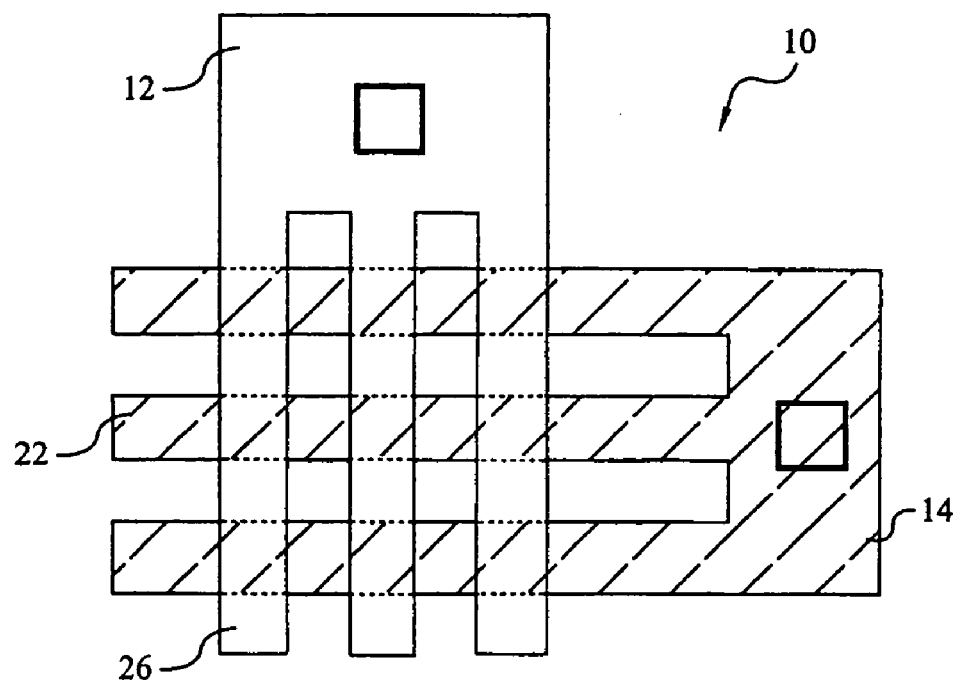
FIG. 5 is a top view of another embodiment of the antifuse of the present invention with increased intersection perimeter.
Figure 5A:
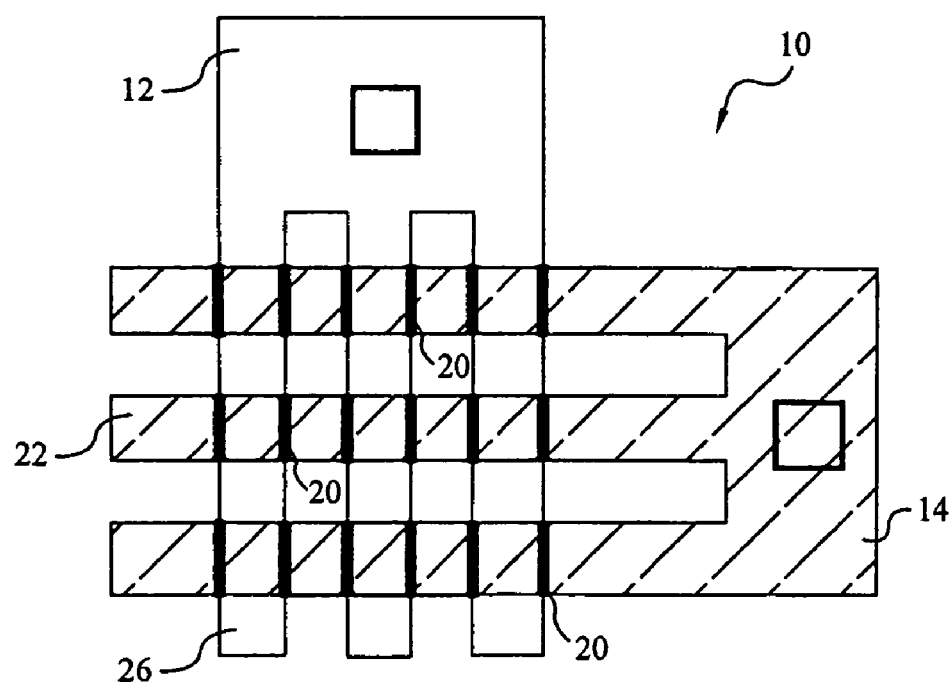
FIG. 5A is a top view of another embodiment of the antifuse of the present invention with the increased intersection perimeter highlighted.

For example, consider the case where the program event occurs along an edge of one of fingers 26. Current traveling from gate contact 16 to diffusion/well contact 18 would encounter low resistance as it passed along gate conductor 12 and as it dropped down a substantially vertical portion of the current path from gate conductor 12 to active area 14 at the location of the programming event. The current would then encounter high resistance only where it traveled underneath a finger 26, because only in those locations would the current travel through high-resistivity N-diffusion. Everywhere else the current would encounter low-resistivity N+ implant. FIGS. 5 and 5A depict a MOS device 10 in which gate conductor 12 has been provided with fingers 26 and active area 14 has been provided with fingers 22 so as to again increase the length of intersection perimeter 20. As is true in the preceding figures, the heavy dark lines indicate regions of intersection perimeter 20, though in FIG. 5A, not all such regions have been marked with reference numerals. One of said fingers 26 and said fingers 22 may have a width substantially equal to a minimum feature size.

Figure 6:
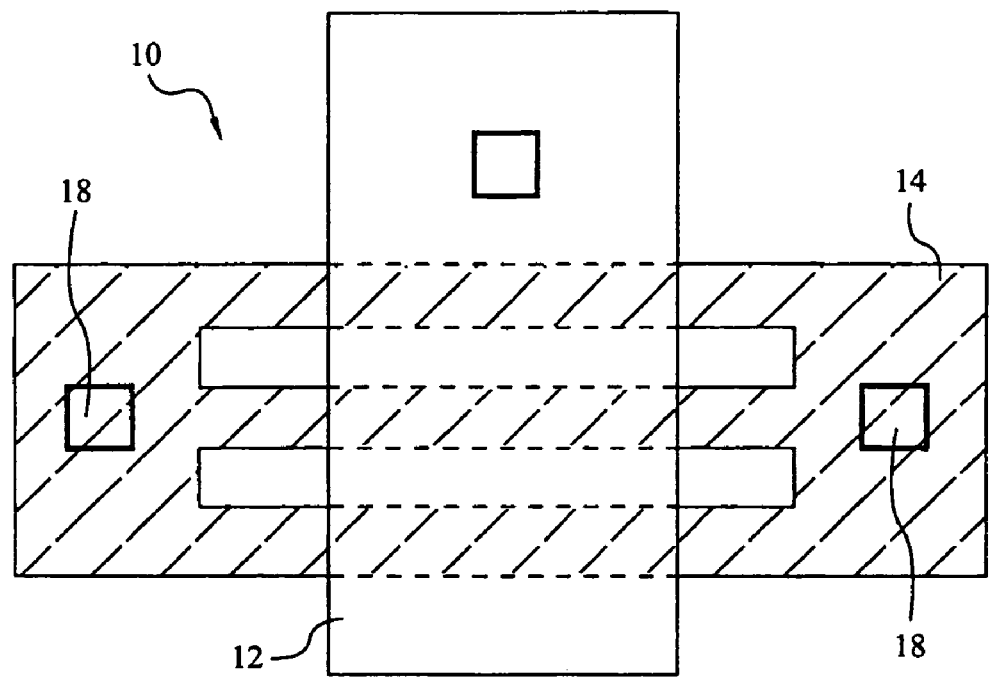
FIG. 6 is a top view of an embodiment of the present invention having dual diffusion/well contacts.
Figure 6A:
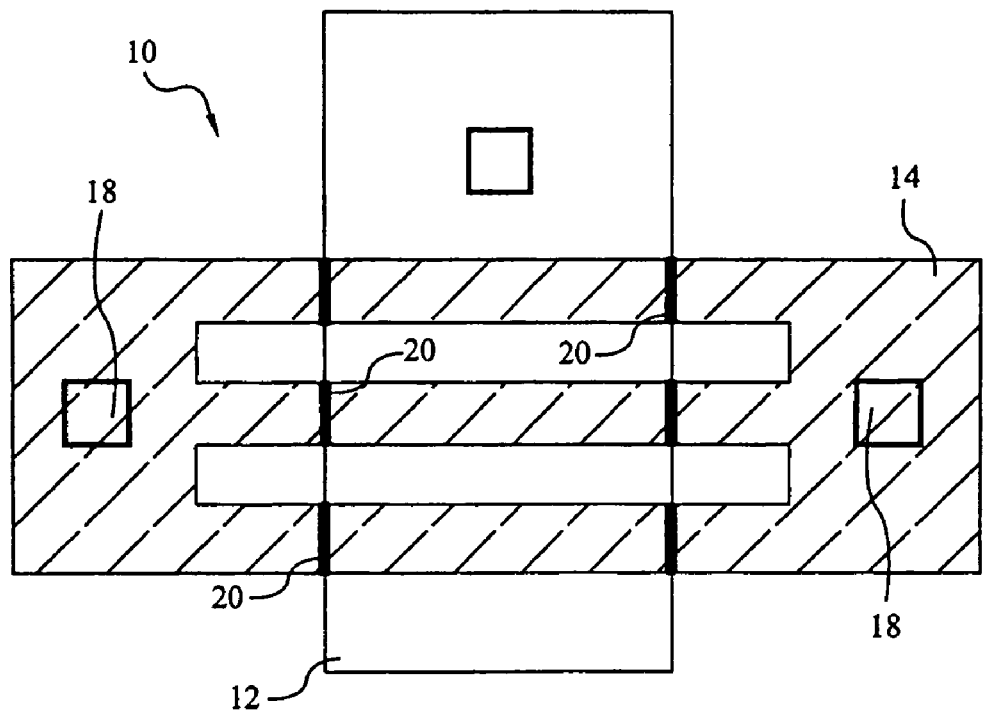
FIG. 6A is a top view of the embodiment of FIG. 6 with the intersection perimeter highlighted.
Figure 7:
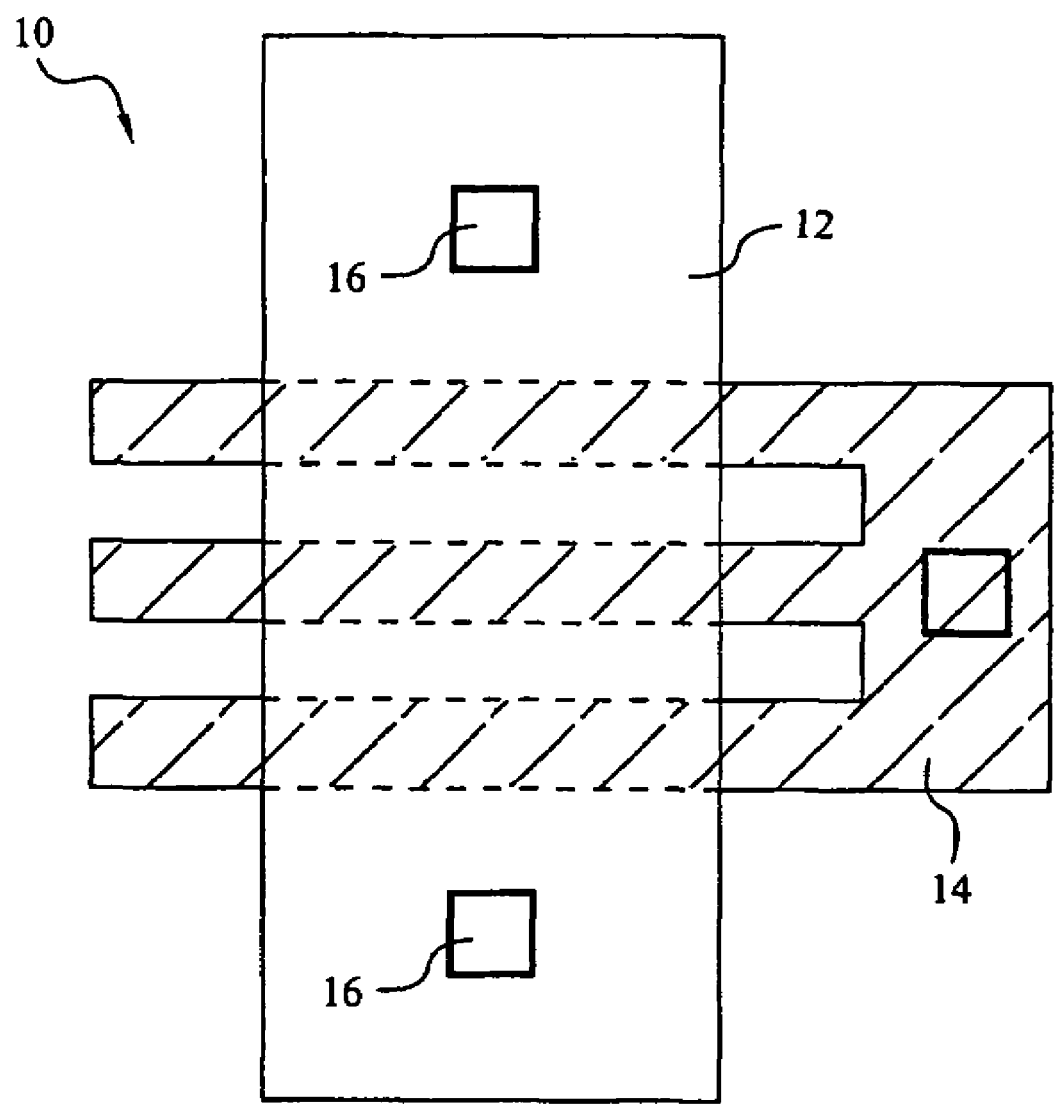
FIG. 7 is a top view of another embodiment of a dual-contact antifuse.
Figure 7A:
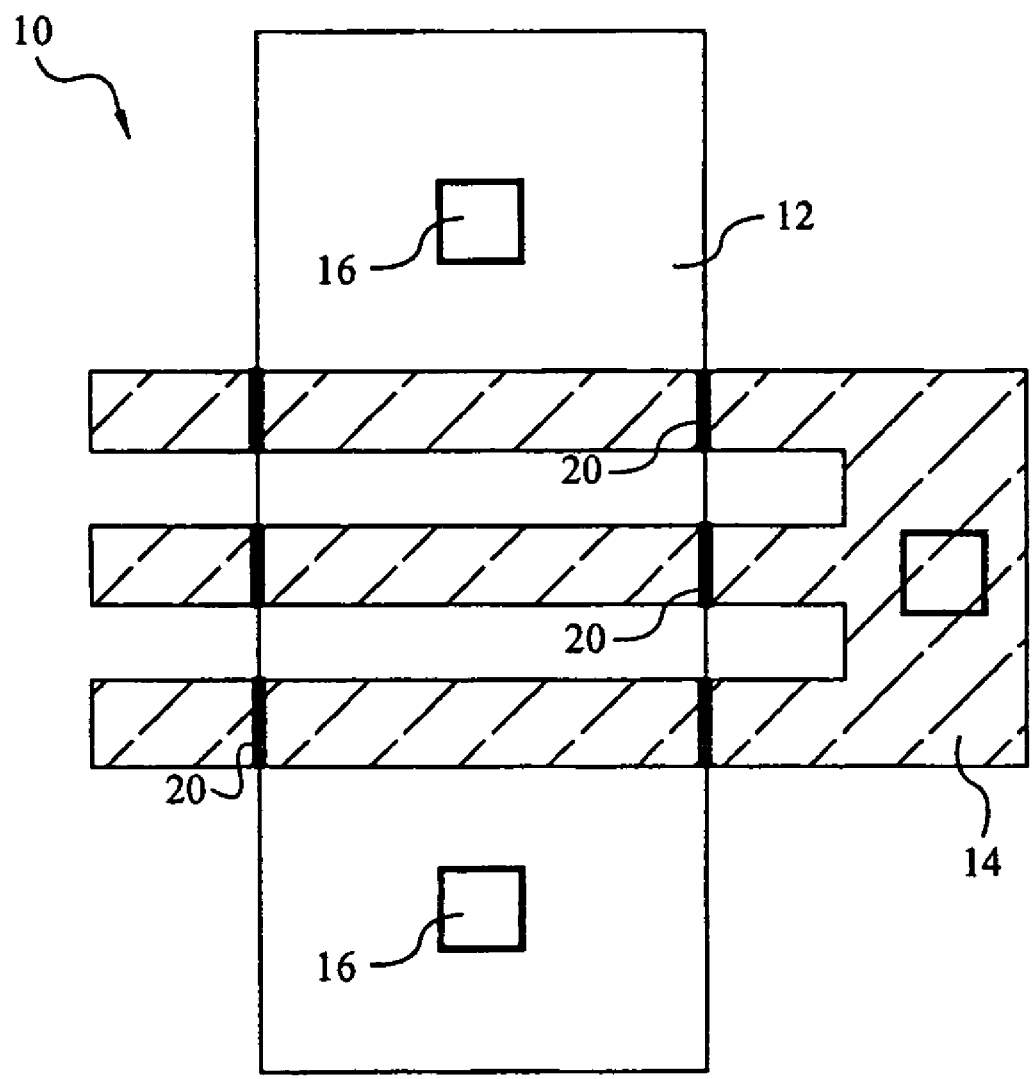
FIG. 7A is a top view of the embodiment of FIG. 7 with the intersection perimeter highlighted.

Conventionally, a programming event comprises the introduction of a current constrained to a level that is not destructive of a device's components. It is possible, however, that a programming event may, for example, vaporize the gate, or otherwise destroy a portion of the MOS device. If a contact were located such that it were isolated, or destroyed, by such an event, it would no longer be readable. A structure adapted to prevent this outcome is depicted in FIGS. 6 and 6A, where MOS device 10 having increased intersection perimeter 20 comprises dual diffusion/well contacts 18, located on either side of gate conductor 12. In this configuration, one side of active area 14 may be used for programming, including the introduction of large currents, while the other side may be used for post programming (post fuse) reading. This structure significantly improves the reliability of this family of fuses. Both contacts 18 may be connected in parallel during readout. FIGS. 7 and 7A illustrate an alternate embodiment of a dual-contact MOS device 10 with increased intersection perimeter 20 wherein gate conductor 12 comprises dual gate contacts 16. Other dual contact device embodiments may also be formed. For example, gate conductor 12 may be provided with fingers, either instead of or in addition to active area 14. In another embodiment, both gate conductor 12 and active area 14 may be provided with dual contacts.

Figure 8:
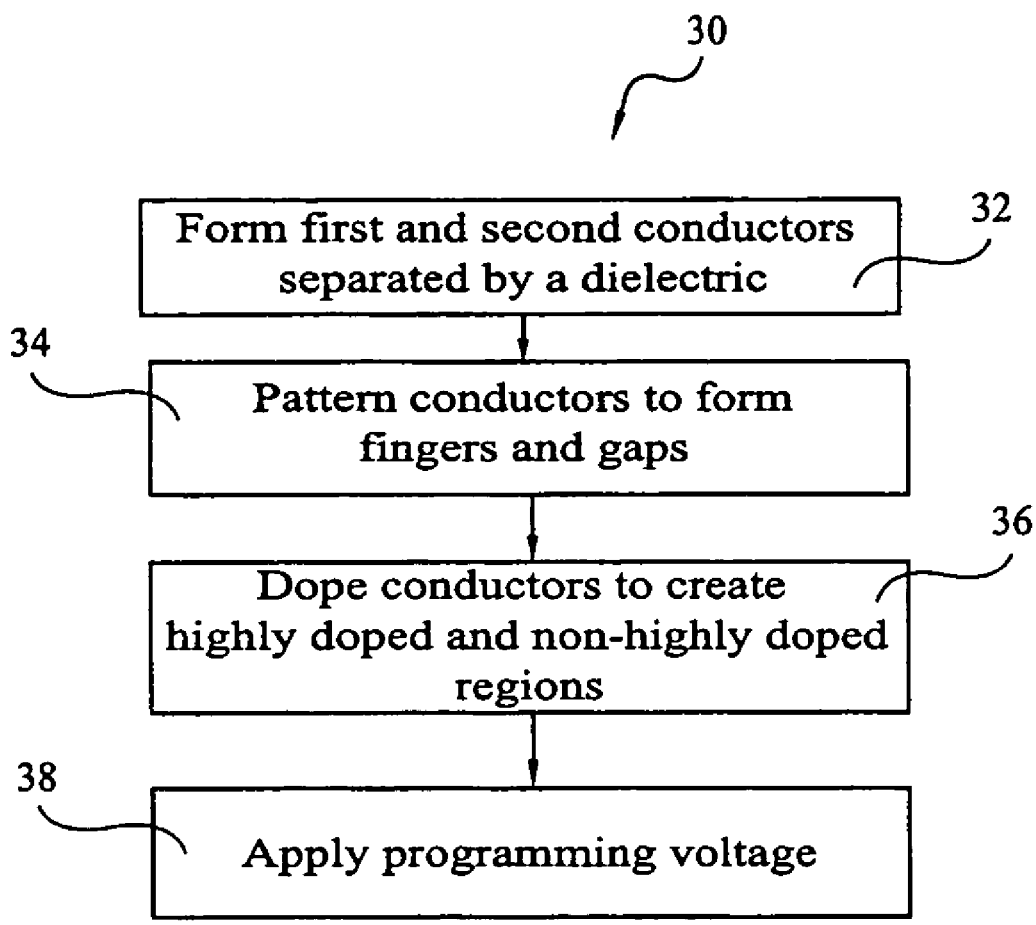
FIG. 8 is a flow diagram illustrating a fabrication and programming method for an antifuse according to an embodiment of the present invention.

Referring now to FIG. 8, a method 30 for fabricating and programming an antifuse according to the present invention is illustrated. A first step 32 of method 30 is to form a first conductor and a second conductor separated by a dielectric. This may be done as part of a standard semiconductor processing operation. In one embodiment, the first conductor is a gate conductor and the second conductor is an active area, or other doped area. A second step 34 of method 30 is to pattern at least one of the conductors to form fingers separated by gaps. This step increases an intersection perimeter of the antifuse, as has been described above. In a third step 36 of method 30, the antifuse is doped with a dopant, thus creating a highly doped region on surfaces not covered by the first conductor, and a non-highly doped region elsewhere. Steps 32 through 36 thus describe one embodiment of a method for fabricating an antifuse according to the present invention. A fourth step 38 of method 30 is to program the antifuse by applying a programming voltage such that a current path is created between the first and second conductors. As has been explained, this current path creation is a statistical event with enhanced probability of being created along the intersection perimeter.

The foregoing description has described selected embodiments of a semiconductor device having an increased intersection perimeter between edge regions of a first conductor and portions of a second conductor. In one embodiment, the intersection perimeter comprises the region where the perimeter of a gate structure overlaps an active area. The intersection perimeter between the conductors directs the breakdown of the dielectric material, increasing the likelihood that the antifuse programming event will be successful. In at least one embodiment, the portion of a current path that travels through a highly doped area is increased while the portion of the path that travels through a non-highly doped area is decreased. This decreases post-program resistance, leading to better response time for the device. The increase of the intersection perimeter, as well as the decrease in post-program resistance, may be accomplished as a part of the normal processing steps.

While the invention has been particularly shown and described with reference to selected embodiments thereof, it will be readily understood by one of ordinary skill in the art that, as limited only by the appended claims, various changes in form and details may be made therein without departing from the spirit and scope of the invention.

What is claimed is:

1. An antifuse on a chip comprising a dielectric material positioned between a conductor and an active area,
   wherein the dielectric material having a first thickness,
   wherein discrete portions of the dielectric material have a second thickness less than the first thickness where an edge portion of the conductor overlaps a first portion of a doped region of the active area,
   wherein the first portion of the doped region is more highly doped directly beneath the edge portion of the conductor than is the first portion of the doped region elsewhere beneath the conductor,
   wherein a short between the conductor and the active area passes through one or more of the discrete portions of the dielectric material programs the antifuse.

2. The anitfuse of claim 1, wherein the dielectric material is in direct mechanical contact with both the conductor and the active area.

3. The anitfuse of claim 2, wherein each discrete portion of the dielectric material where the second thickness is in direct mechanical contact with a trench of a plurality of isolation trenches disposed in the active area.

4. The anitfuse of claim 3, wherein the first thickness of the dielectric material is oriented in a first direction, wherein the second thickness of the dielectric material is oriented in a second direction, and wherein the second direction is not parallel to the first direction.

5. The antifuse of claim 1, wherein the first portion of the doped region is non-highly doped, wherein a second portion of the doped region that is not beneath the conductor is highly doped and is contiguous with the first portion of the doped region.

6. The antifuse claim 5, wherein first and second portions of the doped region each comprise an N-type dopant.

7. The antifuse of claim 5, wherein first and second portions of the doped region each comprise a P-type dopant.

8. An antifuse on a chip comprising a dielectric material positioned between a conductor and an active area,
   wherein the dielectric material having a first thickness,
   wherein discrete portions of the dielectric material have a second thickness less than the first thickness where an edge portion of one of the conductor and the active area overlaps the other of the conductor and the active area,
   wherein a short between the conductor and the active area passes through one or more of the discrete portions of the dielectric material programs the antifuse,
   wherein the short is induced by application of a voltage from an on-chip voltage source to one of the conductor and the active area.

9. The antifuse of claim 8, wherein the voltage is not less than a programming voltage that causes the antifuse to become conductive, and wherein the programming voltage is substantially equal to a burn-in voltage at which the chip is tested for reliability.

10. An antifuse on a chip comprising a dielectric material positioned between a conductor and an active area,
    wherein the dielectric material having a first thickness,
    wherein discrete portions of the dielectric material have a second thickness less than the first thickness where an edge portion of one of the conductor and the active area overlaps the other of the conductor and the active area,
    wherein a plurality or fingers are formed in the conductor,
    wherein the fingers overlay a first portion of the active area, wherein spaces between the plurality of fingers expose a second portion of the active area, wherein the first portion of the active area comprises a non-highly doped region and the second portion of the active area comprises a highly-doped region, and wherein the highly-doped region and the non-highly doped region comprise an N-type implant.

11. The anitfuse of claim 10, wherein the edge portion of the conductor overlaps the active area.

12. The anitfuse of claim 10, wherein the edge portion of the active area overlaps the conductor.

13. The anitfuse of claim 10, wherein each discrete portion of the dielectric material where the second thickness is located is in direct mechanical contact with a trench of a plurality of isolation trenches disposed in the active area.

14. The anitfuse of claim 13, wherein the first thickness of the dielectric material is oriented in a first direction, wherein the second thickness of the dielectric material is oriented in a second direction, and wherein the second direction is not parallel to the first direction.

* * * * *